(12) United States Patent
Bachman et al.

(10) Patent No.: US 7,216,050 B1
(45) Date of Patent: May 8, 2007

(54) SYSTEM AND METHOD FOR TESTING A PRINTED CIRCUIT BOARD ASSEMBLY

(75) Inventors: David A. Bachman, San Jose, CA (US); Carl W. Davies, Athens, OH (US)

(73) Assignee: Nvidia Corporation, Santa Clara, CA (US)

( * ) Notice: Subject to any disclaimer, the term of this patent is extended or adjusted under 35 U.S.C. 154(b) by 55 days.

(21) Appl. No.: 11/007,456

(22) Filed: Dec. 7, 2004

(51) Int. Cl.
*G01D 3/00* (2006.01)
(52) U.S. Cl. .......................... 702/108; 84/610
(58) Field of Classification Search ................ 702/108; 84/610; 714/728, 726; 315/76; 316/796; 365/52
See application file for complete search history.

(56) References Cited

U.S. PATENT DOCUMENTS

| | | | |
|---|---|---|---|
| 2003/0023912 A1* | 1/2003 | Lesea | 714/726 |
| 2003/0131717 A1* | 7/2003 | Shiiya | 84/610 |
| 2005/0166110 A1* | 7/2005 | Swanson et al. | 714/728 |

\* cited by examiner

*Primary Examiner*—John E. Barlow, Jr.
*Assistant Examiner*—Xiuqin Sun

(57) ABSTRACT

A system for testing a printed circuit board assembly (PCBA), in accordance with embodiments of the present invention, includes an interface diagnostic module coupled to a multi-dimensional search module. The multi-dimensional search module performs a simultaneous switching output pattern based stress test for each of a plurality of sets of timing parameters. The interface diagnostic module determines an error rate on an interface of the printed circuit board assembly for each of the stress tests. The multi-dimensional search module determines a best set of timing parameters based on the determined error rates.

19 Claims, 4 Drawing Sheets

SYSTEM AND METHOD FOR TESTING A PRINTED CIRCUIT BOARD ASSEMBLY

BACKGROUND OF THE INVENTION

Referring to FIG. 1, a printed circuit board assembly (PCBA), according to the conventional art is shown. As depicted in FIG. 1, the printed circuit board assembly includes a printed circuit board (PCB) 110, integrated circuits (ICs) 120, 125, connectors 130 and the like. The integrated circuits 120, 125 may for example include a central processing unit (CPU), a graphics processing unit (GPU), control circuits, interface circuits (e.g., a north bridge, south bridge or the like), memory and/or the like. The PCB consists of a substrate that has a plurality of traces 140 for interconnecting the ICs 120, 125 and connectors. The traces 140 and the ICs 120, 125 are interconnected to form a given circuit. Typical interconnections (e.g., interface) between one or more ICs and/or a connector include a bus (e.g., system bus, accelerated graphics bus, peripheral component interface, and the like). The bus typically provides for transmission of one or more data signals, address signals and control signals. The timing relationship between the data signals, address signals and the control signals is typically important to proper operation of the circuit.

Referring now to FIG. 2, a timing diagram illustrating exemplary signals on a bus, according to the conventional art, is shown. As depicted in FIG. 2, the relationship between a DQS control signal 210, 215 and data signals for a write and/or read operation are illustrated. For double data rate write operation the transitions of the DQS control signal 210 are aligned midway between the transitions of the data signals 220. Similarly, for a read operation, the transitions of the DQS control signal 215 are aligned with the transitions of the data signals 225. Typically, the DQS signals 210, 215 are derived from a clock signal. A delay lock loop (DLL) cell may be utilized to delay the clock signal a quarter of a cycle to obtain the DQS signal 210, 215. The DLL cell may also provide for a programmable fine adjustment of the delay in accordance with a stored programming value (e.g., qualified setting). The stored programming value is typically a static value stored in memory (e.g., basic input/output system (BIOS)).

Printed circuit board assembly (PCBA) technology continues to evolve at a rapid pace, continually pushing the various electrical interfaces to higher and higher frequencies. Typically, a programming value for generating a set of timing parameters is determined from a number of qualification samples, and is then applied as a qualified setting across all PCBAs. Due to standard application specific integrated circuit (ASIC) and printed circuit board (PCB) manufacturing tolerances and normal process variations, the industry is reaching the limits where a design using a static qualified setting determined in the product qualification phase is no longer sufficient to guarantee proper operation of a given design across variances in a mass production environment.

SUMMARY OF THE INVENTION

Accordingly, embodiments of the present invention are directed toward a system and method of testing and configuring a printed circuit board assembly. In one embodiment, the system for testing a printed circuit board assembly (PCBA) includes an interface diagnostic module coupled to a multi-dimensional search module. The multi-dimensional search module controls generation of a plurality of sets of timing parameters. The multi-dimensional search module also applies a stress test to an interface on the PCBA. The interface diagnostic module determines an error rate generated by the stress test for each of a plurality of sets of timing parameters. The multi-dimensional search module determines a best set of interface timing parameters from the plurality of sets of timing parameters.

In one embodiment, the method of testing a printed circuit board assembly includes performing a memory stress test for each of a plurality of sets of timing parameters. An error rate for each of the plurality of set of timing parameters may be determined. A best set of timing parameters may be determined based upon the error rates.

The system and method for testing PCBAs, in accordance with embodiments of the present invention, may be utilized to configure PCBAs to operate using a best set of timing parameters on a per PCBA basis. Embodiments advantageously compensates for manufacturing tolerances and process variations that occur when manufacturing PCBAs.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
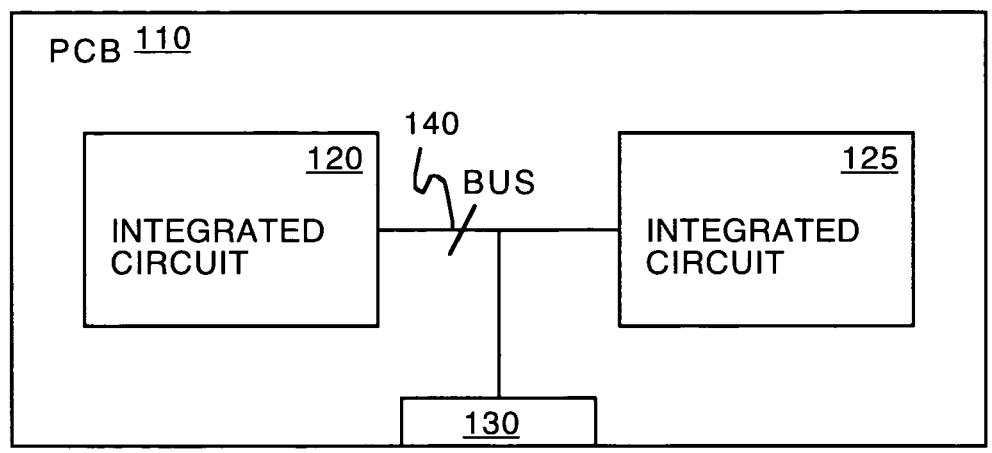
FIG. 1 shows a printed circuit board assembly, according to the conventional art.
Figure 2:
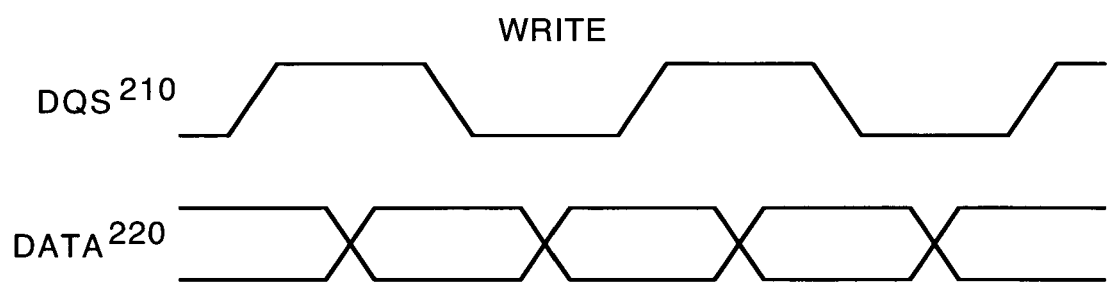
FIG. 2 shows a timing diagram illustrating exemplary signals on a bus, according to the conventional art.
Figure 2:
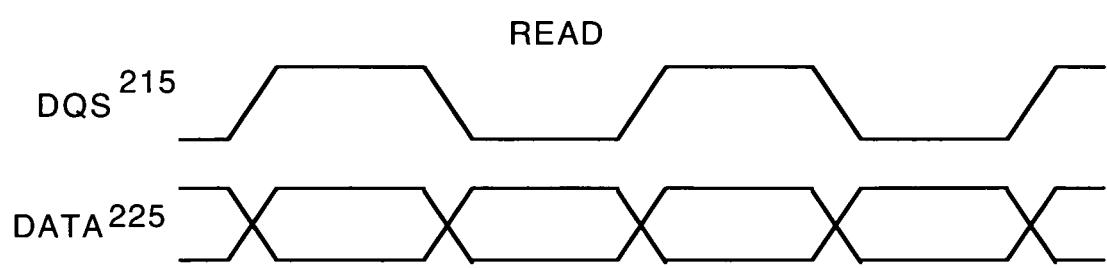
Figure 3:
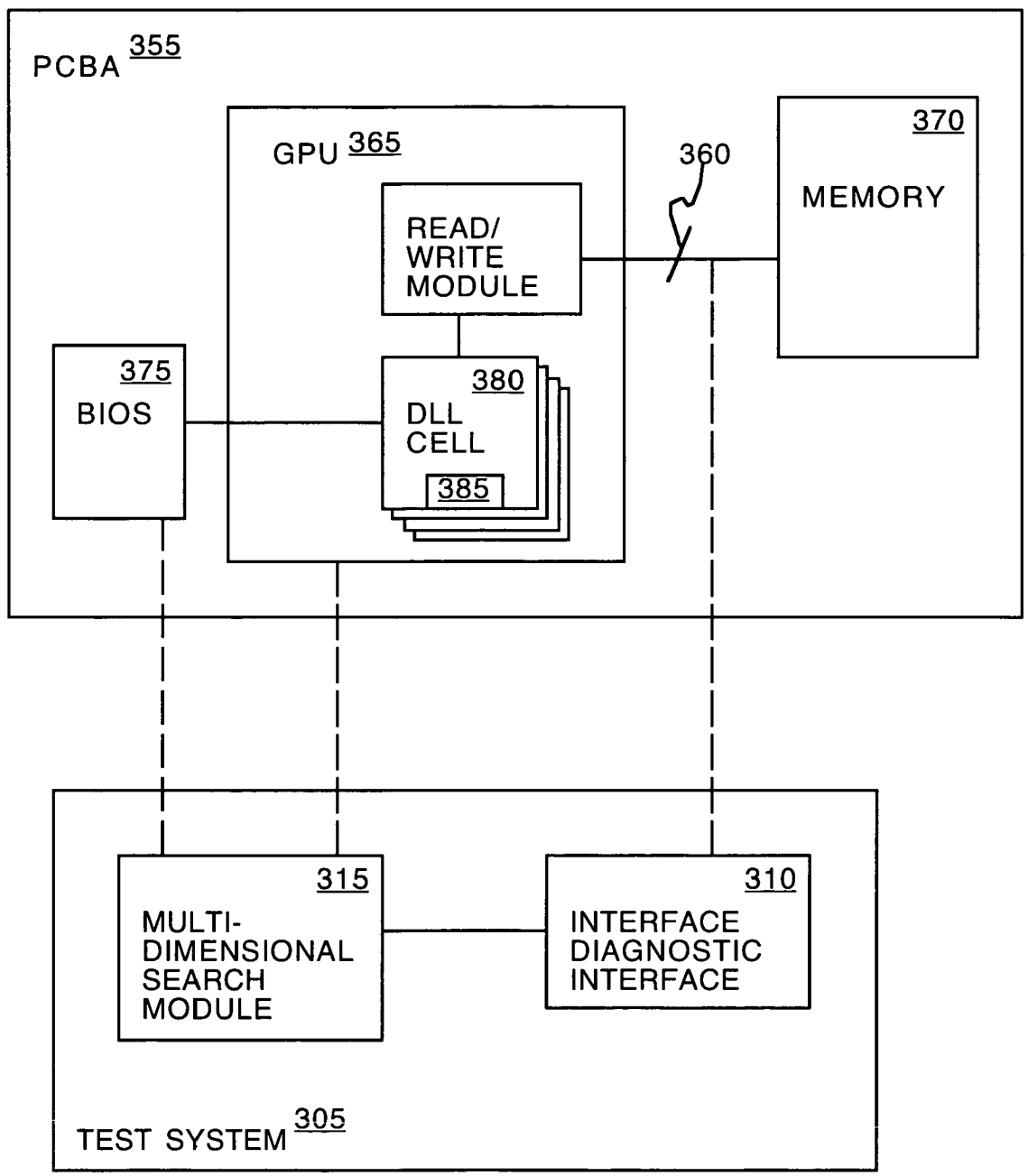
FIG. 3 shows a system for testing a printed circuit board assembly, in accordance with one embodiment of the present invention.

Referring now to FIG. 3, a system 305 for testing a printed circuit board assembly (PCBA) 355, in accordance with one embodiment of the present invention, is shown. As depicted in FIG. 3, the test system 305 may be removable coupled to the PCBA 355. The test system 305 includes an interface diagnostic module 310 and a multi-dimensional search module 315. The multi-dimensional search module 315 controls generation of a plurality of sets of timing parameters on the PCBA 355. The multi-dimensional search module 315 also applies a stress test to an interface 360 of the PCBA 355 for each of the plurality of sets of timing signals. The interface diagnostic module 310 determines the error rate on the interface 360 for each of the plurality of sets of timing parameters. The multi-dimensional search module 315 cycles through the plurality of sets of timing parameters until a best set of interface timing parameters is determined by the interface diagnostic module 310. The interface diagnostic module 315 may configure the PCBA to utilize the best set of interface timing parameters.

In one implementation a graphics processing unit (GPU) 365 may be controlled by the multi-dimensional search module 315 to perform a memory stress test. The memory stress test may consist of reading and writing data from the GPU 365 to a memory 370 across an interface 360 (e.g., bus). In one implementation, the memory stress test may be based upon a simultaneous switching output pattern algorithm. In one implementation, the bus 360 between the GPU 365 and memory 370 may be 256 bits wide, and may be divided into four 64-bit independent partitions. Each partition may be divided into two 32-bit lanes, such that the same instruction for a given partition can be acting upon two different locations in the memory 370. In one implementation, sets of timing parameters (e.g., control signals) for reading and writing data may be generated by one or more delay lock loop (DLL) cells 380. Generally, the DLL cell 380 provides exactly one-quarter cycle delay of a clock signal for generation of the memory strobe signal (DQS), independent of frequency, voltage or temperature.

In one implementation, a given one of a plurality of DLL cell 380 may control generation of timing signals (e.g., DQS) for a given partition. In one implementation, the DLL cell may be programmed to provide one of sixteen adjusted control signals (e.g., a central DQS signal, seven advanced DQS signals and eight delayed DQS signals). A programming register 385 may be utilized to specify the amount of adjustment of the control signal generated by a corresponding DLL cell 380. In one implementation, the programming register 385 for each DLL cell 380 may be divided into four fields. Bits [3:0] control the write DQS for the particular partition, bits [7:4] control the lower lane read DQS, and bits [11:8] control the upper lane read DQS.

In one implementation, the programming register 385 may enable independent adjustment of read control signals (e.g., DQS during read operations) for each lane and allows for common adjustment of write control signals (e.g., DQS during write operations) for both lanes in a partition. However, it is appreciated that various configurations of independent and/or joint control may be implemented depending upon cost/performance criteria.

Figure 4:
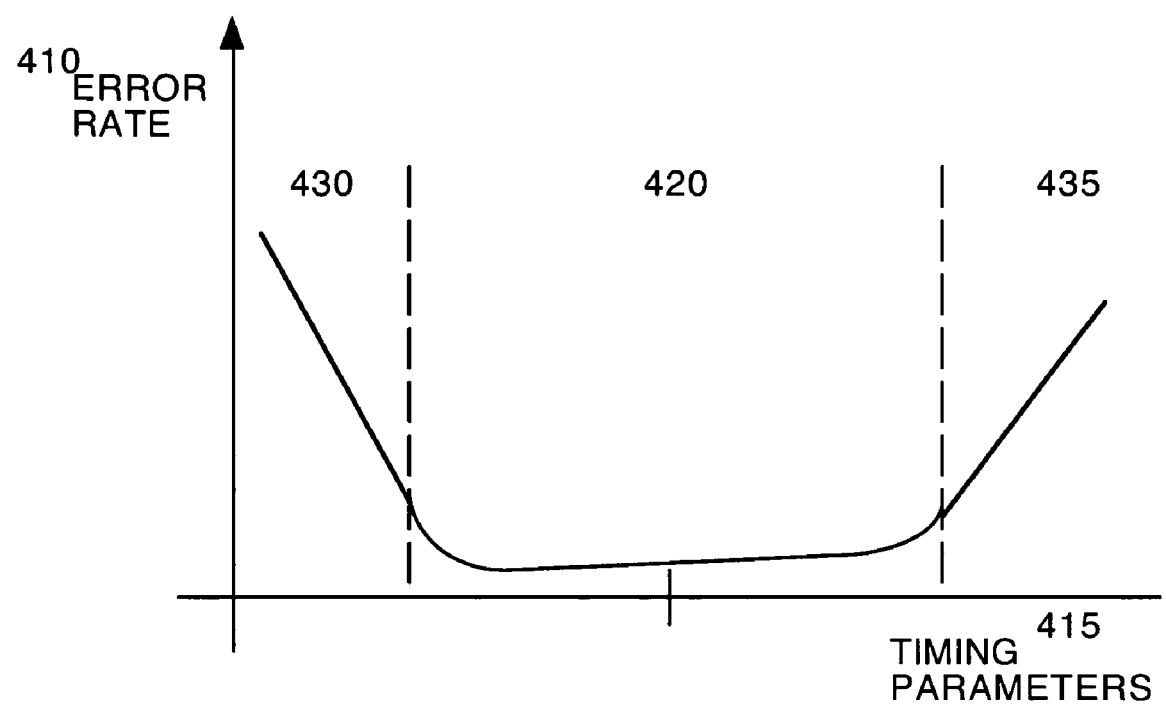
FIG. 4 shows an exemplary error curve, in accordance with one embodiment of the present invention.

The interface diagnostic module 310 determines the error rate on the interface 360 for each of a plurality of sets of timing parameters that the DLL cell 380 generates. Referring now to FIG. 4, an exemplary error curve, in accordance with one embodiment of the present invention, is shown. As depicted in FIG. 4, the exemplary error curve plots the number of errors 410 for each set of timing parameters 415. The curve generally may be a bathtub type curve, wherein the center portion 420 (e.g., window) indicates relatively few errors (e.g., substantially zero) while the error rate increases at either end of the curve 430, 435. It is appreciated that the error curve may vary for read and write operations on the same partition and/or lane, for the same operation on different partitions and/or lanes, and/or operations on different PCBAs.

Referring again to FIG. 3, a programming value that generates the best set of timing parameters, for a given operation on a given lane, partition and/or PCBA, may be determined by the multi-dimensional search module 315. In one implementation, the best set of timing parameters for controlling operation of the DLL cell 380 may be the sets of timing parameters that minimizes the error rate relative to the other sets of parameters. In another implementation, a window of passing values (e.g., error rates that are below a predetermined maximum error limit) is determined. For a passing window with an odd number of passing values the best set of timing parameters may be the set of timing parameters that produce the error rate centered in the window. For a passing window with an even number of passing values, the best set of timing parameters may be the set of timing parameters that produce the error rate most centered but biased toward a default set of timing parameters. In another implementation, the best set of timing parameters may be the set of timing parameters that provides the largest margin between timing parameters that produce error rates that exceed a predetermined maximum limit.

The programming value that causes the DLL cell to generate the best set of timing parameters may then be stored in memory (e.g., basic input/output system (BIOS) 375) by the multi-dimensional search module 315. It is appreciated that after testing (e.g., normal operation of the PCBA), the programming value may be loaded from the memory into the programming register 385 associated with the corresponding DLL cell 380 upon initialization thereof.

Figure 5:
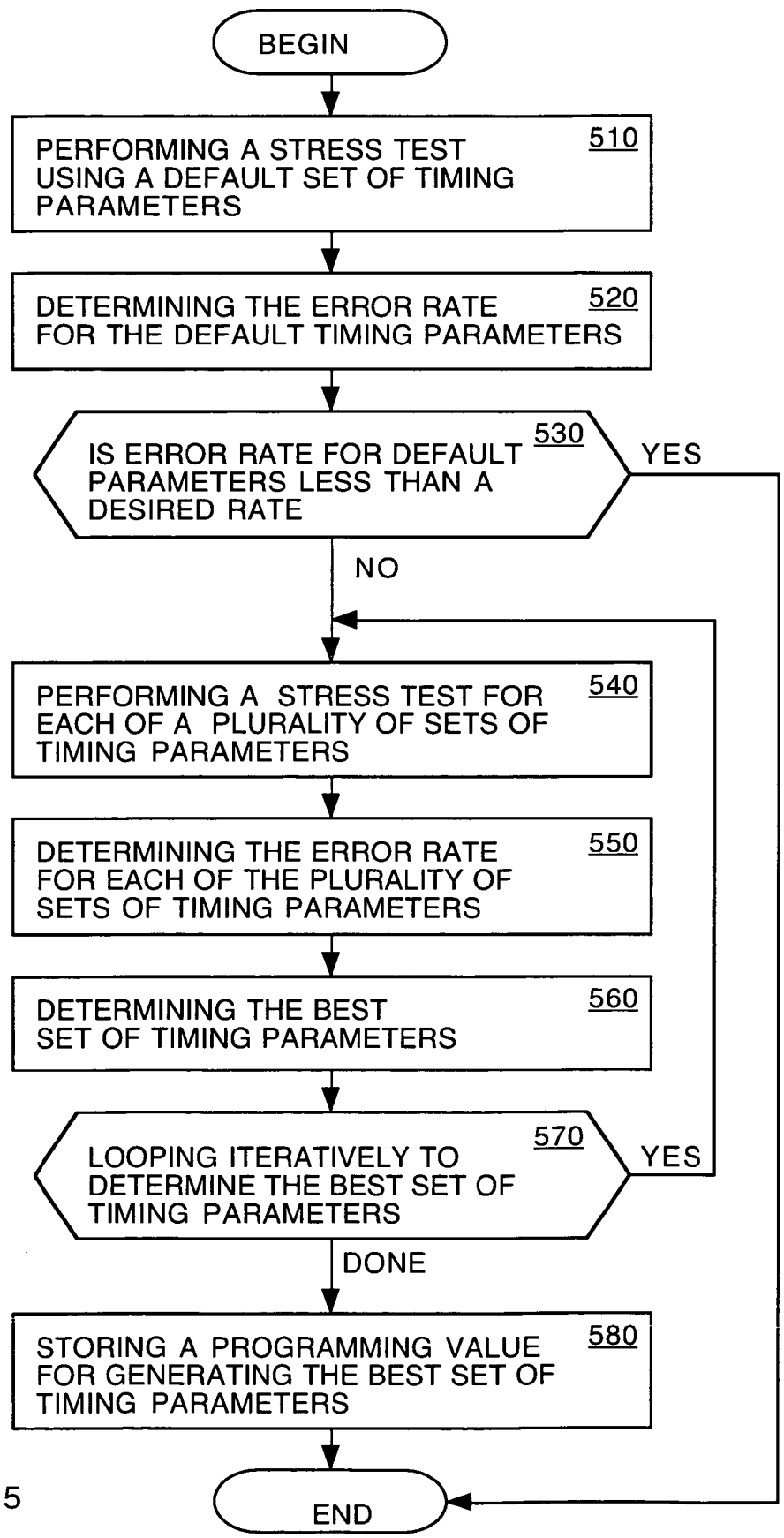
FIG. 5 shows a method of testing a printed circuit board assembly, in accordance with one embodiment of the present invention.

Referring now to FIG. 5, a method of testing a printed circuit board assembly (PCBA), in accordance with one embodiment of the present invention, is shown. The method of testing includes performing a memory stress test on a PCBA for each of a plurality of sets of timing parameters, at step 540. A simultaneous switching output pattern algorithm may be applied for each of the plurality of timing parameters. The timing parameters may be generated by varying the timing (e.g., increasing and/or decreasing the delay) of one or more control signals (e.g., memory strobe signal DQS).

At 550, the error rate for each of the plurality of sets of timing parameters may be measured. In one implementation, the error rate may be determined for each increase and/or decrease in the delay of the one or more control signals. At 560, a best set of timing parameters may be determined. In one implementation, the best set of timing parameters may be the set of timing parameters that minimizes the error rate relative to the other sets of parameters. In another implementation, a window of passing values (e.g., error rates that are below a predetermined maximum error limit) is determined. For a passing window with an odd number of passing values the best set of timing parameters may be the set of timing parameters that produce the error rate centered in the window. For a passing window with an even number of passing values, the best set of timing parameters may be the set of timing parameters that produce the error rate most centered but biased toward a default set of timing parameters. In another implementation, the best set of timing parameters may be the set of timing parameters that provides the largest margin between set of timing parameters that produce error rates that exceed a predetermined maximum limit.

It is appreciated that it may be difficult to determine write errors from read errors during the memory stress test. Accordingly, selecting a best set of read control signals may adversely affect the error rate for write control signals, and vice versa. Therefore, at optional step 570, the process may iteratively loop through steps 540-560 to determine the best set of timing parameters for read operations and the best set of timing parameters for write operations. In one implementation steps 540-560 are alternatingly repeated three times for read operations and three times for write operations. For example, a first pass determines a best set of timing parameters for reading, a second pass determines a best set of timing parameters for writing utilizing the best set of timing parameters for reading, a third pass determines an improved best set of timing parameters for reading utilizing the best set of timing parameters for writing, a fourth pass determines an improved best set of timing parameters for writing utilizing the improved best set of timing parameters for reading, a fifth pass determines a further improved best set of timing parameter for reading utilizing the improved best set of timing parameters for writing, and a sixth pass determines a further improved best set of timing parameters for writing utilizing the further improved best set of timing parameters for reading.

At 580, the best set of timing parameters may be stored on the PCBA. In one implementation, a programming value, such that the best set of timing parameters will be generated by the control logic (e.g., DLL cell), may be stored in a memory (e.g., basic input/output system (BIOS)). In one implementation programming values, such that the further improved best set of timing parameters for reading and the further improved best set of timing parameters for writing will be generated by the corresponding DLL cell, may be stored in the BIOS. After storing the programming value for generating the best set of timing parameters, the method of testing the PCBA may be terminated.

At optional step 510, the PCBA is tested utilizing a default set of timing parameters. In one implementation the default set of timing parameters may be the qualified settings determined from a number of qualification samples. A memory stress test utilizing the default set of timing parameters may be performed on the PCBA. At optional step 520, the error rate for the default set of timing parameters may be determined. At optional step 530, if the error rate determined for the default set of timing parameters is less than a desired rate (e.g., passing), the default settings can be left unchanged in memory (e.g., BIOS) and testing of the PCBA may be terminated. If the error rate determined for the default set of timing parameters is more than a desired rate, steps 540-580 may be executed to determine a best set of timing parameters.

Accordingly, embodiments of the present invention provide a system and method for configuring one or more electrical interfaces on a PCBA. The PCBA may be advantageously configured to operate utilizing a best set of timing parameters on a per PCBA basis. Embodiments advantageously compensates for manufacturing tolerances and process variations that can occur on a PCBA.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A test system comprising:
    an interface diagnostic module for determining an error rate on an interface of a printed circuit board assembly; and
    a multi-dimensional search module coupled to said interface diagnostic module, for controlling generation of a plurality of sets of timing parameters that include a centered memory strobe signal, a plurality of advance memory strobe signals and a plurality of delayed memory strobe signals on said printed circuit board assembly, for applying a stress test to said interface for determining a best set of interface timing parameters and for storing a programming value corresponding to said best set of interface timing parameters.

2. The system of claim 1, wherein said stress test comprises a simultaneous switching output pattern algorithm memory stress test.

3. The system of claim 1, wherein said multi-dimensional search module is removably couplable to a delay lock loop on said printed circuit board, wherein said delay lock loop generates said plurality of sets of timing parameters.

4. The system of claim 1, wherein said best set of timing parameters is determined for a given printed circuit board assembly.

5. The test system of claim 1, wherein said best set of timing parameters comprises the set of timing parameters that correspond to the error rate substantially centered in a window of said determined error rates that are below a predetermined maximum error limit.

6. The test system of claim 1, wherein said best set of timing parameters comprises the set of timing parameters that provides the largest margin between sets of timing parameters that exceed a predetermined maximum error limit.

7. The test system of claim 1, wherein said best set of timing parameters comprises the set of timing parameters that minimizes the error rate relative to the other sets of timing parameters.

8. A method of testing a printed circuit board assembly comprises:
    a) performing a memory stress test for each of a plurality of sets of timing parameters;
    b) determining an error rate for each of said plurality of sets of timing parameters; and
    c) determining a best set of timing parameters, wherein determining said best set of timing parameters includes:
        determining a window of passing values that include error rates that are below a predetermined maximum error limit;
        selecting the set of timing parameters that produce the error rate centered in the window of passing values, for the window of passing values having an odd number of passing values;
        selecting the set of timing parameters that produce the error rate most centered but biased toward a default set of timing parameters, for the window of passing values having an even number of passing values; and
        configuring the printed circuit board assembly to utilize the selected set of timing parameters.

9. The method according to claim 8, further comprising storing a programming value for generating the best set of timing parameters.

10. The method according to claim 8, further comprising looping iteratively through steps a), b) and c) to determine said best set of timing parameters.

11. The method according to claim 10, wherein looping iteratively comprises alternatingly repeating steps a), b) and c) for a read process and a write process.

12. The method according to claim 8, further comprising:
performing said memory stress test using a default set of timing parameters;
determining an error rate for said default set of timing parameters;
performing steps a), b) and c) if said error rate for said default set of timing parameters is greater than a desired rate; and
terminating said method without performing steps a) b) and c) if said error rate for said default set of timing parameters is less than said desired rate.

13. The method according to claim 8, wherein said memory stress test comprises applying a simultaneous switching output pattern algorithm for each of said plurality of sets of timing parameters.

14. The method according to claim 8, wherein said plurality of set of timing parameters includes a first timing signal, said first timing signal advanced a plurality of times and said first timing signal delayed a plurality of times.

15. A computer-readable medium containing a plurality of instructions which when executed cause a test system to implement a method of testing a printed circuit board assembly comprising:
a) controlling generation of a plurality of sets of timing parameters on a printed circuit board assembly comprising a centered memory strobe signal, a plurality of advanced memory strobe signals and a plurality of delayed memory strobe signals;
b) performing a simultaneous switching output pattern based stress test for each of a plurality of sets of timing parameters;
b) determining an error rate on an interface of said printed circuit board assembly for each of said stress tests;
c) determining a best set of timing parameters based on said error rates;
d) repeating steps a), b) and c) alternatingly for a read process and a write process; and
e) storing the best set of timing parameters after repeating steps a), b) and c) alternating.

16. The computer-readable medium according to claim 15, further comprising:
f) performing said simultaneous switching output pattern based stress test using a default set of timing parameters;
g) determining an error rate on said interface for said default set of timing parameters;
h) performing steps a), b), c) and d) if said error rate for said default set of timing parameters is greater than a desired rate;
i) terminating said method without performing steps a) b), c) and d) if said error rate for said default set of timing parameters is less than said desired rate; and
j) storing said default set of timing parameters if said error rate for said default set of timing parameters is less than said desired rate.

17. The computer-readable medium according to claim 15, wherein determining said best set of timing parameters comprises an adjusted memory strobe signal that corresponds to a minimum one of said determined error rates.

18. The computer-readable medium according to claim 15, wherein determining said best set of timing parameters comprises:
determining a window of passing values that includes said determined error rates that are below a predetermined maximum error limit; and
selecting an adjusted memory strobe signal that corresponds to the error rate substantially centered in the window of passing values.

19. The computer-readable medium according to claim 15, wherein determining said best set of timing parameters comprises:
determining a window of passing values that includes error rates that are below a predetermined maximum error limit;
selecting the set of timing parameters that produce the error rate centered in the window of passing values, for the window of passing values having an odd number of passing values; and
selecting the set of timing parameters that produce the error rate most centered but biased toward a default set of timing parameters, for the window of passing values having an even number of passing values.

* * * * *